(12) United States Patent
Doetz et al.

(10) Patent No.: US 8,137,822 B2
(45) Date of Patent: Mar. 20, 2012

(54) SYNTHESIS OF PHENYL-SUBSTITUTED POLYFLUOROANTHENES AND THE USE THEREOF

(75) Inventors: Florian Doetz, Heidelberg (DE); Simon Nord, Roemerberg (DE); Horst Weiss, Neuhofen (DE); Joachim Roesch, Ludwigshafen (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 1042 days.

(21) Appl. No.: 11/912,998

(22) PCT Filed: Apr. 3, 2006

(86) PCT No.: PCT/EP2006/061282
§ 371 (c)(1),
(2), (4) Date: Oct. 29, 2007

(87) PCT Pub. No.: WO2006/114364
PCT Pub. Date: Nov. 2, 2006

(65) Prior Publication Data
US 2008/0213623 A1    Sep. 4, 2008

(30) Foreign Application Priority Data

Apr. 28, 2005   (DE) .................. 10 2005 019 880

(51) Int. Cl.
*H01L 51/54* (2006.01)
*C09K 11/06* (2006.01)

(52) U.S. Cl. ........ 428/690; 428/917; 313/504; 313/506; 252/301.16; 257/40; 257/E51.028; 257/E51.036; 526/280; 526/346; 528/220

(58) Field of Classification Search .................. None
See application file for complete search history.

(56) References Cited

U.S. PATENT DOCUMENTS

| 2003/0181617 | A1  | 9/2003 | Schwalm et al. |
| 2007/0069198 | A1* | 3/2007 | Dotz et al. ............. 257/40 |

FOREIGN PATENT DOCUMENTS

| DE | 102 11 648 A1 | 9/2003 |
| EP | 0 707 020 A2 | 4/1996 |
| WO | WO 90/13148 | 11/1990 |
| WO | WO 2004/095888 A1 | 11/2004 |
| WO | WO 2005/033051 A1 | 4/2005 |

OTHER PUBLICATIONS

Mark T. Bernius, et al., "Progress with Light-Emitting Polymers", Advanced Materials, vol. 12, No. 23, Dec. 1, 2000, pp. 1737-1750.
Robert J. Waltman, et al., "The Electrochemical Oxidation and Polymerization of Polycyclic Hydrocarbons", J. Electrochem. Soc., vol. 132, No. 3, Mar. 1985, pp. 631-634.
Lothar Dunsch, et al., "In-situ-EPR-UV/Vis/NIR-spektroelektrochemische Untersuchungen zur Strukturabhängigkeit der redoxinduzierten Dimerisierung: Fluoranthenopyracylen-Oligomere", Angew. Chem., vol. 114, No. 12, 2002, pp. 2187-2190.
J. K. Stille, et al., "Hydrocarbon Ladder Aromatics from a Diels-Alder Reaction", Journal of Polymer Science Part A, vol. 8, 1970, pp. 2245-2254.
J. Bisberg, et al., "Excimer Emission and Wavelength Control from Light-Emitting Diodes Based on Side-Chain Polymers", Macromolecules, vol. 28, No. 1, 1995, pp. 386-389.
K. Ghosh, et al., Synthesis of Arylated Fluoranthene Derivatives, Indian J. Chem., XP-000570586A, vol. 16B, Feb. 1978, pp. 152-153.

* cited by examiner

*Primary Examiner* — Jennifer A Chriss
*Assistant Examiner* — Michael H Wilson
(74) *Attorney, Agent, or Firm* — Oblon, Spivak, McClelland, Maier & Neustadt, L.L.P.

(57) ABSTRACT

The invention relates to a method for producing polyfluoroanthenes containing repeat units of general formula (I), said method consisting of the following steps: a) a monomer fluoroanthene derivative of formula IIa is produced; b) optionally the monomer fluoroanthene derivative of formula IIa is converted into another monomer fluoroanthene derivative of formula IIb; and c) the monomer fluoroanthene derivative of formula IIa or IIb is polymerised, optionally together with at least one other comonomer. The invention also relates to polyfluoroanthenes that can be produced according to the inventive method, films, a light-emitting layer containing or consisting of at least one inventive polyfluoroanthene, OLEDs containing at least one inventive polyfluoroanthene, OLEDs containing an inventive light-emitting layer, a device containing an inventive OLED, and the use of the inventive polyfluoroanthene emitter substances in OLEDs.

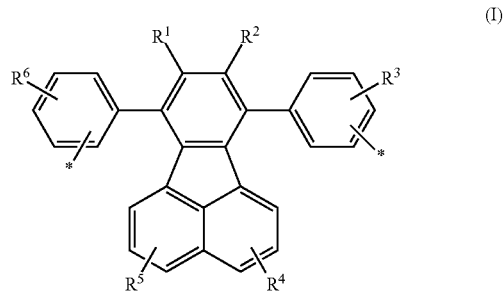

21 Claims, No Drawings

SYNTHESIS OF PHENYL-SUBSTITUTED POLYFLUOROANTHENES AND THE USE THEREOF

The present invention relates to a process for preparing polyfluoranthene derivatives, polyfluoranthene derivatives which can be prepared by the process of the invention, films comprising or consisting of at least one polyfluoranthene derivative according to the invention, organic light-emitting diodes (OLEDs) comprising at least one polyfluoranthene derivative according to the invention, a light-emitting layer comprising or consisting of at least one polyfluoranthene derivative according to the invention, an OLED comprising the light-emitting layer of the invention, devices comprising an OLED according to the invention, and also the use of the polyfluoranthene derivatives of the invention as emitter substances in OLEDs.

Organic light-emitting diodes (OLEDs) exploit the ability of materials to emit light when they are excited by an electric current. OLEDs are of particular interest as alternatives to cathode ray tubes and liquid crystal displays for producing flat VDUs.

Numerous materials which emit light when excited by an electric current have been proposed.

An overview of OLEDs is disclosed, for example, in M. T. Bernius et al., Adv. Mat. 2000, 12, 1737. The demands made of the compounds used are high and the known materials are usually not able to meet all the requirements.

Apart from inorganic and low molecular weight organic electroluminescence materials, the use of polymeric electroluminescence materials in OLEDs is also described in the prior art. Inorganic and low molecular weight organic electroluminescence materials as light-emitting layer in OLEDs are generally applied by vapor deposition of the inorganic or low molecular weight organic material under reduced pressure. However, a vapor deposition process is unsuitable for mass production of OLEDs and is subject to restrictions in the production of devices having large-area displays. Furthermore, production of a thin film from low molecular weight organic electroluminescence materials by coating methods is problematical when these materials are used without matrix materials. In comparison, polymeric electroluminescence materials have the advantage that they can be applied in the form of a film from solution, for example by spin coating or dipping, which makes it possible to produce large-area displays simply and inexpensively.

WO 90/13148 relates to OLEDs comprising polymers based on poly(p-phenylene-vinylene) (PPV). Such polymers are suitable, in particular, for electroluminescence in the red and green spectral regions.

In the blue spectral region, derivatives of poly(fluorene)s (PF) are usually used. Poly(fluorene) derivatives having spiro centers are disclosed, for example, in EP-A 0 707 020.

Although the abovementioned PPV and PF derivatives mostly have satisfactory optical properties such as emission color and quantum yield of the emission, they generally lack the required long-term stability. The reasons for this extend from morphological instability through excimer formation to oxidative degradation of the chromophore.

Polymers and copolymers comprising repeating units based on fluoranthene and its derivatives are known from the prior art.

R. J. Waltmann et al., J. Electrochem. Soc. 1985, 132, 631 to 634, relates to polymers obtained by electropolymerization of fluoranthene. Polymers which are structurally very non-uniform and whose poor solubility and processability prevent detailed characterization are obtained. Films produced from the polymers obtained by electropolymerization of fluoranthene are brittle and have a low conductivity.

L. Dunsch et al., Angew. Chem. 2002, 114, 12, 2187 to 2190, relates to fluoranthenopyrazylene oligomers which are obtained by repetitive Diels-Alder reaction and subsequent aromatization. Dienes used are cyclopentadienone derivatives which react with suitable dienophiles with cheleotropic carbon monoxide elimination.

J. K. Stille et al., J. Polym. Sci. Part A 1970, 8, 2245 to 2254, describe the preparation of conductive aromatic polymers by Diels-Alder homopolycycloaddition. Monomers used are cyclopentadienone derivatives which at the same time have a diene unit and a dienophile unit in the same molecule. These monomers react by Diels-Alder polycycloaddition with elimination of carbon monoxide to form the desired conductive polymers.

R. A. Gaudiana et al., Macromolecules 1995, 28, 368 to 389, relates to polymethacrylates and polysiloxanes which have luminescent side groups. For example, a polymethacrylate having fluoranthene side groups, viz poly[2-(3-fluoranthenylureido)ethyl methacrylate] is disclosed. These polymers can be used in OLEDs.

DE-A 102 11 648 relates to polymers based on fluoranthene and their use in OLEDs. To produce these polymers, functionalized fluoranthenes are polymerized. The functionalization of the fluoranthenes in DE-A 102 11 648 is carried out by halogenation of fluoranthene or by nitration of fluoranthene and appropriate further reaction to form the desired monomers.

It is an object of the present invention to provide further polyfluoranthene dervatives which are suitable for use in OLEDs, in particular as emitter molecules, and have a long life, are highly efficient in OLEDs, have an emission maximum in the blue region and have a high quantum yield. A further object of the present invention is to provide a process for preparing such polyfluoranthenes.

This object is achieved by a process for preparing polymers comprising repeating units of the general formula I

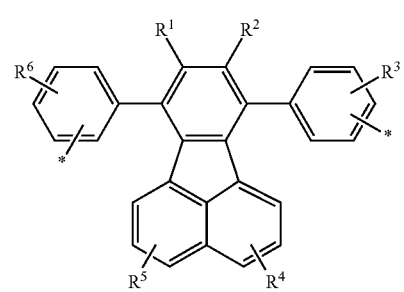

which comprises the following steps:
a) Preparation of a monomeric fluoranthene derivative of the formula IIa

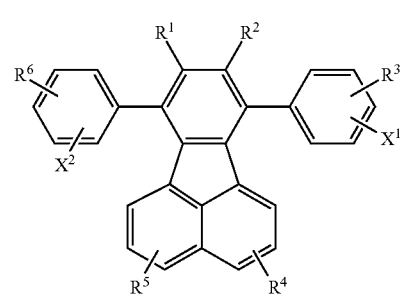

by reaction of a compound of the formula III

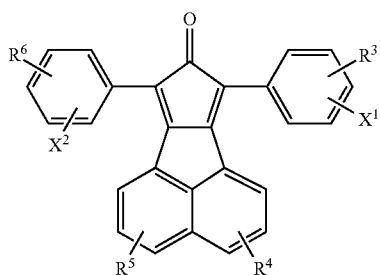

(III)

with an alkynyl compound of the formula IV

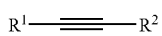

(IV)

and subsequent carbon monoxide elimination;
b) if appropriate, reaction of the monomeric fluoranthene derivative of the formula IIa to form a monomeric fluoranthene derivative of the formula IIb

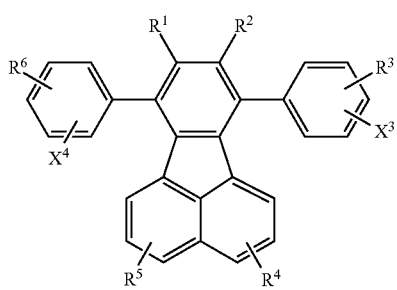

(IIb)

c) Polymerization of the monomeric fluoranthene derivative of the formula IIa or IIb, if appropriate together with at least one further comonomer selected from the group consisting of further fluoranthene derivatives of the formula IIa or IIb which are different from the first fluoranthene derivative of the formula IIa or IIb, aromatic, fused aromatic and heteroaromatic compounds which each have two groups $X^5$ and $X^6$ which can be polymerized with the groups $X^1$ and $X^2$ of the fluoranthene derivative of the formula IIa or the groups $X^3$ and $X^4$ of the fluoranthene derivative of the formula IIb;
where the symbols have the following meanings:
$R^1$, $R^2$, $R^3$
$R^4$, $R^5$, $R^6$ are each, independently of one another, H, an alkyl radical, an alkynyl radical, an aryloxy radical, an aromatic radical, a fused aromatic ring system, a heteroaromatic radical, —CH=CH$_2$, trans- or cis-CH=CH—C$_6$H$_5$, acryloyl, methacryloyl, methylstyryl, —O—CH=CH$_2$ or glycidyl,

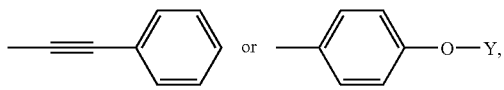

where Y is acryloyl, methacryloyl, ortho- or para-methylstyryl, —O—CH=CH$_2$ or glycidyl;
$X^1$, $X^2$, $X^3$, $X^4$
$X^5$, $X^6$ are groups which can be polymerized with one another.

Such extended, phenyl-substituted fluoranthene derivatives of the formula IIa or IIb cannot be provided with polymerizable groups $X^1$ and $X^2$ or $X^3$ and $X^4$ in a defined way giving a defined structure by conventional means. For example, bromination of 7, 8, 9, 10-tetraphenylfluoranthene gives isomer mixtures and the selective introduction of bromine equivalents is not successful. For this reason, the polymerizable groups $X^1$ and $X^2$ are selectively introduced into the phenyl-substituted fluoranthene in step a) of the process of the invention by building up the fluoranthene framework from afresh, with the polymerizable groups being inserted in the first stage of the synthesis. The key reaction here is the Diels-Alder reaction of the diene cyclopentaacenaphthenone which is substituted by the polymerizable groups $X^1$ and $X^2$ with an acetylene derivative as dienophile with cheletropic elimination of carbon monoxide.

For the purposes of the present patent application, "alkyl" is a linear, branched or cyclic substituted or unsubstituted $C_1$-$C_{20}$-, preferably $C_1$-$C_{10}$-alkyl group. It is particularly preferably a linear or branched $C_3$-$C_{10}$-, very particularly preferably $C_5$-$C_9$-alkyl group. The alkyl groups can be unsubstituted or substituted by aromatic radicals, halogen, nitro, ether or carboxyl groups. The alkyl groups are particularly preferably unsubstituted or substituted by aromatic radicals. Preferred aromatic radicals are mentioned below. Furthermore, one or more nonadjacent carbon atoms of the alkyl group can be replaced by Si, P, O or S, preferably by O or S. Halogen groups are preferably F, Cl or Br.

For the purposes of the present patent application, "alkynyl" is a linear, branched or cyclic substituted or unsubstituted $C_2$-$C_{20}$-, preferably $C_2$-$C_{10}$-alkynyl group. It is particularly preferably a linear or branched $C_2$-$C_8$-, very particularly preferably $C_2$-$C_6$-alkynyl group. The alkynyl groups can be unsubstituted or substituted by aromatic radicals, halogen, nitro, ether or carboxyl groups. The alkynyl groups are particularly preferably unsubstituted or substituted by aromatic radicals. Preferred aromatic radicals are mentioned below.

For the purposes of the present patent application, aryloxy is a —O—Ar group. The aryl group in the aryloxy radical is preferably a $C_6$-aryl group (phenyl group) or naphthyl group, particularly preferably a phenyl group. This aryl group can be unsubstituted or substituted by linear, branched or cyclic $C_1$-$C_{10}$-, preferably $C_1$-$C_9$-alkyl groups which may in turn be substituted by halogen, nitro, ether or carboxyl groups. Furthermore, one or more carbon atoms of the alkyl group can be replaced by Si, P, O, S or N, preferably O or S. Furthermore, the aryl groups can be substituted by halogen, nitro, carboxyl groups, amino groups or alkoxy groups or $C_6$-$C_{14}$-, preferably $C_6$-$C_{10}$-aryl groups, in particular phenyl or naphthyl groups. Halogen groups are preferably F, Cl or Br. The aryl group in the aryloxy radical is particularly preferably a $C_6$-aryl group which may optionally be substituted by halogen, preferably Br, Cl or F, amino groups, preferably NAr'Ar", where Ar' and Ar" are, independently of one another, $C_6$-aryl groups which, as defined above, can be unsubstituted or substituted, and/or nitro groups. This aryl group in the aryloxy radical is very particularly preferably unsubstituted.

For the purposes of the present patent application, an "aromatic radical" is generally an aryl group, preferably a $C_6$-aryl group (phenyl group) or naphthyl group, particularly preferably a phenyl group. This aryl group can be unsubstituted or substituted by linear, branched or cyclic $C_1$-$C_{10}$-, preferably $C_1$-$C_9$-alkyl groups which may in turn be substituted by halogen, nitro, ether or carboxyl groups. Furthermore, one or more carbon atoms of the alkyl group can be replaced by Si, P, O, S or N, preferably O or S. Furthermore, the aryl groups can be substituted by halogen, nitro, carboxyl groups, amino groups or alkoxy groups or $C_6$-$C_{14}$-, preferably $C_6$-$C_{10}$-aryl groups, in particular phenyl or naphthyl groups. Halogen groups are preferably F, Cl or Br. An "aromatic radical" is particularly preferably a $C_6$-aryl group which may optionally be substituted by halogen, preferably Br, Cl or F, amino groups, preferably NAr'Ar'', where Ar' and Ar'' are, independently of one another, $C_6$-aryl groups which, as defined above, may be unsubstituted or substituted, and/or nitro groups. This aryl group is very particularly preferably unsubstituted or substituted by NAr'Ar''.

For the purposes of the present patent application, a "fused aromatic ring system" is a fused aromatic ring system which generally has from 10 to 20 carbon atoms, preferably from 10 to 14 carbon atoms. These fused aromatic ring systems can be unsubstituted or substituted by linear, branched or cyclic $C_1$-$C_{20}$-, preferably $C_1$-$C_{10}$-alkyl groups which may in turn be substituted by halogen, nitro, ether or carboxyl groups. Furthermore, one or more carbon atoms of the alkyl group can be replaced by Si, P, O, S or N, preferably O or S. Furthermore, the fused aromatic groups can be substituted by halogen, nitro, carboxyl groups, amino groups or alkoxy groups or $C_6$-$C_{14}$-, preferably $C_6$-$C_{10}$-aryl groups, in particular phenyl or naphthyl groups. A "fused aromatic ring system" is particularly preferably a fused aromatic ring system which may optionally be substituted by halogen, preferably Br, Cl or F, amino groups, preferably NAr'Ar'', where Ar and Ar' are, independently of one another, $C_6$-aryl groups which, as defined above, may be unsubstituted or substituted, or nitro groups. The fused aromatic ring system is very particularly preferably unsubstituted. Suitable fused aromatic ring systems are, for example, naphthalene, anthracene, pyrene, phenanthrene or perylene.

For the purposes of the present patent application, a "heteroaromatic radical" is a $C_4$-$C_{14}$-, preferably $C_4$-$C_{10}$-, particularly preferably $C_4$-$C_6$-heteroaryl group comprising at least one N or S atom. This heteroaryl group can be unsubstituted or substituted by linear, branched or cyclic $C_1$-$C_{20}$-, preferably $C_1$-$C_9$-alkyl groups which may in turn be substituted by halogen, nitro, ether or carboxyl groups. Furthermore, one or more carbon atoms of the alkyl group can be replaced by Si, P, O, S or N, preferably O or S. Furthermore, the heteroaryl groups can be substituted by halogen, nitro, carboxyl groups, amino groups or alkoxy groups or $C_6$-$C_{14}$-, preferably $C_6$-$C_{10}$-aryl groups. Halogen groups are preferably F, Cl or Br. A "heteroaromatic radical" is particularly preferably a heteroaryl group which may optionally be substituted by halogen, preferably Br, Cl or F, amino groups, preferably NArAr', where Ar and Ar' are, independently of one another, $C_6$-aryl groups which, as defined above, may be unsubstituted or substituted, or nitro groups. The heteroaryl group is very particularly preferably unsubstituted.

The radicals $R^4$ and $R^5$ in the compounds of the formulae I, IIa, IIb and III are preferably H, alkyl, alkynyl, aryloxy; and particular preference is given to $R^4$ and $R^5$ each being H.

The radicals $R^3$ and $R^6$ in the compounds of the formulae I, IIa, IIb and III are preferably H, alkyl, alkynyl, aryloxy; and particular preference is given to $R^3$ and $R^6$ each being H.

The radicals $R^1$ and $R^2$ in the compounds of the formulae I, IIa, IIb and IV are preferably alkyl radicals, particularly preferably $C_3$-$C_{10}$-alkyl radicals, very particularly preferably $C_5$-$C_9$-alkyl radicals. The alkyl radicals can be linear or branched, and they are very particularly preferably linear.

$X^1$ and $X^2$ are preferably each halogen selected from among F, Cl, Br and I or $NO_2$; and particular preference is given to $X^1$ and $X^2$ each being Cl or Br.

$X^3$ and $X^4$ are preferably each halogen selected from among F, Cl, Br and I, particularly preferably Cl or Br, esterified sulfonate or a boron-comprising radical of the formula —B(O—[C($R^7$)$_2$]$_n$—O), where the radicals $R^7$ are identical or different and are each, independently of one another, H or $C_1$-$C_{20}$-alkyl and n is an integer from 2 to 10, and $X^3$ and $X^4$ are each particularly preferably para-toluenesulfonate (tosylate), triflate ($F_3$—$SO_3$), para-nitrophenylsulfonate (nosylate), para-bromosulfonate (brosylate), very particularly preferably triflate, or a boron-comprising radical of the formula —B(O—[C($R^7$)$_2$]$_n$—O), where
the radicals $R^7$ are identical or different and are each hydrogen or $C_1$-$C_{20}$-alkyl, for example methyl, ethyl, n-propyl, isopropyl, n-butyl, isobutyl, sec-butyl, tert-butyl, n-pentyl, isopentyl, sec-pentyl, neopentyl, 1,2-dimethylpropyl, isoamyl, n-hexyl, isohexyl, sec-hexyl, n-heptyl, isoheptyl, n-octyl, n-decyl, n-dodecyl or n-octadecyl; preferably $C_1$-$C_{12}$-alkyl such as methyl, ethyl, n-propyl, isopropyl, n-butyl, isobutyl, sec-butyl, tert-butyl, n-pentyl, isopentyl, sec-pentyl, neopentyl, 1,2-dimethylpropyl, isoamyl, n-hexyl, isohexyl, sec-hexyl or n-decyl, particularly preferably $C_1$-$C_4$-alkyl such as methyl, ethyl, n-propyl, isopropyl, n-butyl, isobutyl, sec-butyl or tert-butyl, very particularly preferably methyl; and n is an integer from 2 to 10, preferably from 2 to 5. Very particular preference is given to boron-comprising radicals of the formula —B(O—[C($CH_3$)$_2$]$_2$)—O);

$X^5$ and $X^6$ are preferably each halogen selected from among F, Cl, Br and I, particularly preferably Cl or Br; or esterified sulfonate or a boron-comprising radical of the formula —B(O—[C($R^7$)$_2$]$_n$—O), where the radicals $R^7$ are identical or different and are each, independently of one another, H or $C_1$-$C_{20}$-alkyl and n is an integer from 2 to 10, and $X^5$ and $X^6$ are each particularly preferably para-toluenesulfonate (tosylate), triflate ($F_3$—$SO_3$), para-nitrophenylsulfonate (nosylate), para-bromosulfonate (brosylate), very particularly preferably triflate, or a boron-comprising radical of the formula —B(O—[C($R^7$)$_2$]$_n$—O), where
the radicals $R^7$ are identical or different and are each hydrogen or $C_1$-$C_{20}$-alkyl, for example methyl, ethyl, n-propyl, isopropyl, n-butyl, isobutyl, sec-butyl, tert-butyl, n-pentyl, isopentyl, sec-pentyl, neopentyl, 1,2-dimethylpropyl, isoamyl, n-hexyl, isohexyl, sec-hexyl, n-heptyl, isoheptyl, n-octyl, n-decyl, n-dodecyl, or n-octadecyl; preferably $C_1$-$C_{12}$-alkyl such as methyl, ethyl, n-propyl, isopropyl, n-butyl, isobutyl, sec-butyl, tert-butyl, n-pentyl, isopentyl, sec-pentyl, neopentyl, 1,2-dimethylpropyl, isoamyl, n-hexyl, isohexyl, sec-hexyl or n-decyl, particularly preferably $C_1$-$C_4$-alkyl such as methyl, ethyl, n-propyl, isopropyl, n-butyl, isobutyl, sec-butyl or tert-butyl, very particularly preferably methyl; and n is an integer from 2 to 10, preferably from 2 to 5. Very particular preference is given to boron-comprising radicals of the formula —B(O—[C($CH_3$)$_2$]$_2$)—O).

The radicals $X^1$ and $X^2$ or $X^3$ and $X^4$ and $X^5$ and $X^6$ are selected with the following provisos:
when $X^1$ and $X^2$ are each halogen or $X^3$ and $X^4$ are each halogen, esterified sulfonate or a boron-comprising radical, then $X^5$ and $X^6$ are likewise each halogen, esterified sulfonate or a boron-comprising radical, with the radicals $X^1$ and $X^2$ or $X^3$ and $X^4$ and $X^5$ and $X^6$ being selected so that the molar ratio of halogen and esterified sulfonate to boron-comprising radical is from 0.8:1 to 2.1:1, preferably 0.9:1.1 to 1.1:0.9, preferably 1:1; or so that the radicals $X^1$ and $X^2$ in the monomeric fluoranthene derivative of the formula IIa are each halogen and reacted, if appropriate, with further comonomers whose radicals $X^5$ and $X^6$ are likewise each halogen. In the case of "end-capping", where only the end groups of a polymer have to be introduced, far smaller amounts of polymerizable groups are sufficient (10-20 mol % based on the total amount of monomer). These end caps are, however, monofunctionalized in order to stop chain growth, i.e. they are compounds of the formula IIa or IIb which each bear only one group $X^1$ or $X^2$ (in the case of compounds of the formula IIa) or $X^3$ or $X^4$ (in the case of compounds of the formula IIb).

Step a)

The fluoranthene derivatives of the general formula IIa are prepared by reacting cyclopentanacenaphthenone derivatives (hereinafter referred to as acecyclone derivatives) of the formula III with alkynyl compounds of the formula IV. The preparation is carried out by a method analogous to those disclosed in Dilthey et al., Chem. Bar. 1938, 71, 974, and Van Allen et al., J. Am. Chem. Soc., 1940, 62, 656. The halogen-substituted acecyclone derivative of the formula III is prepared by methods known from the prior art. Halogenated acecyclone derivatives are disclosed, for example, in JP 2000-007587. Acecyclone derivatives of the formula III which bear radicals $X^1$ and $X^2$ and whose preparation is not disclosed in the prior art can be obtained by methods analogous to methods of the prior art.

The alkynyl compounds of the formula IV can likewise be prepared by methods known to those skilled in the art. Suitable methods are disclosed, for example, in Hagihara et al., Synthesis (1980), 627, and L. Cassar, J. Organometh. Chem. 93 (1979), 253. The molar ratio of the acecyclone derivative of the formula III to the alkynyl compound of the formula IV is generally from 1:1 to 1.3:1, preferably from 1:1 to 1.1:1 The reaction of step a) of the process of the invention is a Diels-Alder reaction with subsequent carbon monoxide elimination.

The reaction is generally carried out in a solvent, preferably in an organic nonpolar solvent, particularly preferably in an organic nonpolar solvent having a boiling point of generally above 100° C., preferably above 140° C., particularly preferably above 260° C.

Suitable solvents are, for example, toluene, xylene, diphenyl ether, methylnaphthalene, mesitylene, glycols and their ethers, decalin and mixtures of the solvents mentioned.

In a preferred embodiment of the process of the invention, the acecyclone derivative of the formula III and the alkynyl compound of the formula IV are both introduced into the organic solvent and the mixture is heated to temperatures of generally from 140 to 260° C., preferably from 140 to 170° C. or from 240 to 260° C. The temperature is dependent on the reactivity of the starting materials. Terminal alkynes ($R^2$=H in the formula IV) generally react at relatively low temperatures, preferably at from 140 to 190° C., particularly preferably from 140 to 170° C., very particularly preferably from 140 to 160° C., while internal alkynes ($R^2 \neq H$ in the formula IV) generally react at higher temperatures, preferably at from 190 to 260° C., particularly preferably from 220 to 260° C., very particularly preferably from 240 to 260° C.

The reaction time is generally from 8 to 30 hours. The reaction time depends on the bulkiness of $R^1$ and $R^2$ in the formula IV. The reaction time is preferably from 8 to 18 hours, particularly preferably from 10 to 16 hours, very particularly preferably from 14 to 16 hours.

The reaction mixture obtained is precipitated in a polar solvent, for example in methanol, ethanol, or, if appropriate, in a nonpolar solvent such as cyclohexane. In the case of particularly soluble fluoranthene derivatives, the precipitation step can be omitted. The product obtained is worked up by methods known to those skilled in the art. The work-up is preferably carried out by means of column chromatography. As eluent, it is possible to use any suitable eluent or eluent mixtures. Very particular preference is given to using an ethyl acetate/cyclohexane mixture.

The resulting halogenated fluoranthene derivatives of the formula IIa can either be used directly in the polymerization in step c) or can be converted into fluoranthene derivatives of the formula IIb in step b), depending on the type of polymerizable groups $X^1$, $X^2$ or $X^3$, $X^4$ desired.

Step b)

Step b) is optional and is only carried out when fluoranthene derivatives of the formula IIb are used in the subsequent polymerization (step c)).

The conversion of the halide radicals $X^1$ and $X^2$ in the monomeric fluoranthene derivative of the formula IIa into the radicals $X^3$ and $X^4$ selected from among halogen, esterified sulfonate and boron-comprising radicals as defined above, as in the formula IIb, is carried out by methods known to those skilled in the art. It should be pointed out that $X^3$ or $X^4$ can be halogen in the cases in which the respective other radical is not halogen. Fluoranthene derivatives in which both polymerizable groups are halogen are already comprised by the fluoranthene derivatives of the formula IIa.

The preparation of fluoranthene derivatives of the formula IIb in which $X^3$ and/or $X^4$ are/is a boron-comprising radical of the formula —B(O—[C($R^7$)$_2$]$_n$—O) is carried out, for example, by metallation of compounds of the formula IIa in which $X^1$ and $X^2$ are halogen, preferably chlorine or bromine, particularly preferably bromine. A reaction with at least two or at least four equivalents of a strong organometallic base is firstly carried out, resulting in single or double metallation, and the product is subsequently reacted with one or two equivalents of a boron compound of the general formula $X^7$—B(O—[C($R^7$)$_2$]$_n$—O), where the radicals $R^7$ are identical or different and are each, independently of one another, H or $C_1$-$C_{20}$-alkyl, n is an integer from 2 to 10 and $X^7$ is $C_1$-$C_6$-alkoxy such as methoxy, ethoxy, n-propoxy, isopropoxy, n-butoxy, isobutoxy, sec-butoxy, tert-butoxy, n-pentoxy, isopentoxy, n-hexoxy and isohexoxy, preferably methoxy, ethoxy, n-propoxy, isopropoxy and n-butoxy, particularly preferably isopropoxy. Preferred radicals $R^7$ and definitions of n have been mentioned above.

As base, it is possible to use the metal alkyls customary in organometallic chemistry, for example methyllithium, ethyllithium, n-butyllithium, sec-butyllithium, tert-butyllithium or hexyllithium; or Grignard compounds, for example ethylmagnesium bromide. Suitable solvents are high-boiling solvents such as toluene, ortho-xylene, meta-xylene, para-xylene, ethylbenzene or mixtures thereof. Furthermore, acyclic or cyclic ethers such as 1,2-dimethoxyethane, tetrahydrofuran, dioxane or diethyl ether are also suitable as solvents.

The reaction time for the metallation is generally from 1 to 10 hours, preferably from 2 to 5 hours. The temperature conditions are generally not critical; the metallation is preferably carried out at temperatures of from −90° C. to −20° C.

The singly or doubly metallated compound is subsequently reacted with at least one or two equivalents of the abovementioned boron compound. For this purpose, the two components are mixed with one another in a suitable solvent such as benzene, toluene, ethylbenzene, ortho-xylene, meta-xylene or para-xylene, chlorobenzene, cyclohexane, acetonitrile, tetrahydrofuran, 1,2-dimethoxyethane, dioxane or diethyl ether or a mixture thereof. This reaction is generally carried out at temperatures of from −100° C. to 150° C., preferably from −78° C. to +100° C. It is important that the reaction is carried out with exclusion of oxygen and moisture. The pressure conditions are generally not critical; the reaction is preferably carried out at atmospheric pressure. The reaction time is generally from 10 minutes to 2 days, preferably from 1 hour to 24 hours.

The work-up and purification of the monomeric fluoranthene derivatives IIb in which $X^3$ and/or $X^4$ are/is a boron-comprising radical can be carried out by conventional methods, for example by extraction, perforation, crystallization, chromatography, reprecipitation or sublimation.

The abovementioned boron compounds of the formula $X^7$—B(O—[C($R^7$)$_2$]$_n$)—O can be prepared by methods known to those skilled in the art; some derivatives are commercially available.

A further possible way of converting halogenating aromatics into the appropriate boronic esters is reaction with diboronates (OR)$_2$B—B(OR)$_2$ in the presence of a palladium catalyst such as PdCl$_2$(dppf) using the method of Miyaura, e.g. as described in J. Org. Chem. 1995, 60, 7508.

Fluoranthene derivatives of the formula IIb, in which $X^3$ and/or $X^4$ are/is esterified sulfonate can be prepared from fluoranthene derivatives of the formula IIa in which $X^1$ and/or $X^2$ are/is a nitro group. To convert the nitro group into an esterified sulfonate group, it is possible, for example, to carry out a reduction of the nitro group to an amino group, diazotization of the amino group using NaNO$_2$/HCl or amyl nitrite and thermal decomposition of the diazonium salts and, finally, reaction of the phenolic OH groups obtained with the appropriate chlorosulfonic acid groups, for example CF$_3$SO$_2$Cl (giving a triflate) or para-CH$_3$—C$_6$H$_4$—SO$_2$Cl (giving a tosylate).

A further possibility is reaction of an aromatic diazonium salt which has been synthesized as above with a halogenated aromatic, as described, for example, by Wegner et al. in Chem. Eur. J. 2004, 10, 2681. Chem. Eur. J. 2004, 10, 2681, describes the synthesis of an aromatic diazonium salt and the conditions for a C—C coupling of such a diazonium salt with an aromatic boronic ester.

Step c)

The monomeric fluoranthene derivatives of the formulae IIa and/or IIb are, if appropriate together with at least one further comonomer selected from the group consisting of further fluoranthene derivatives of the formula IIa or IIb which are different from the first fluoranthene derivative of the formula IIa or IIb, aromatic, fused aromatic and heteroaromatic compounds which each have two groups $X^5$ and $X^6$ which can be polymerized with the groups $X^1$ and $X^2$ of the fluoranthene derivatives of the formula IIa or the groups $X^3$ or $X^4$ of the fluoranthene derivatives of the formula IIb.

In principle, the polymerization in step c) can, depending on the polymerizable groups of the monomeric fluoranthene derivatives $X^1$ and $X^2$ or $X^3$ and $X^4$ or the polymerizable groups $X^5$ and $X^6$ of any further comonomers used, be carried out by means of any suitable polymerization process. Suitable polymerization processes and the polymerizable groups required for them are described, for example, in EP-A 1 245 659 (pages 26 to 31).

In a preferred embodiment, the polymerization of the fluoranthene derivatives of the formula IIa and/or IIb, if appropriate together with at least one further comonomer, is carried out, for example, by Yamamoto coupling or by the Suzuki reaction in the presence of nickel or palladium compounds.

In this embodiment, $X^1$ and $X^2$ are each halogen selected from among F, Cl, Br and I; or $X^3$ and $X^4$ are each halogen selected from among F, Cl, Br and I, esterified sulfonate or a boron-comprising radical of the formula —B(O—[C($R^7$)$_2$]$_n$—O and $X^5$ and $X^6$ are each halogen selected from among F, Cl, Br and I, esterified sulfonate or a boron-comprising radical of the formula —B(O—[C($R^7$)$_2$]$_n$—O;

the radicals $R^7$ are identical or different and are each, independently of one another, H or $C_1$-$C_{20}$-alkyl;

n is an integer from 2 to 10;

where the radicals $X^1$ and $X^2$ or $X^3$ and $X^4$ and also $X^5$ and $X^6$ are selected so that the molar ratio of halogen and esterified sulfonate to boron-comprising radical is from 0.8:1 to 2.1:1, preferably from 0.9:1.1 to 1.1:0.9, preferably 1:1; or so that the radicals $X^1$ and $X^2$ in the monomeric fluoranthene derivative of the formula IIa are each halogen and are reacted, if appropriate, with further comonomers whose radicals $X^5$ and $X^6$ are likewise each halogen. In the case of "end-capping", where only the end groups of a polymer have to be introduced, far smaller amounts of polymerizable groups are sufficient (10-20 mol % based on the total amount of monomer). These end caps are, however, monofunctionalized in order to stop chain growth, i.e. they are compounds of the formula IIa or IIb which each bear only one group $X^1$ or $X_2$ (in the case of compounds of the formula IIa) or $X^3$ or $X^4$ (in the case of compounds of the formula IIb);

or, so that the radicals $X^1$ and $X^2$ in the monomeric fluoranthene derivative are each halogen and these are reacted, if appropriate, together with further comonomers in which the radicals $X^5$ and $X^6$ are likewise each halogen. This means that, as a first alternative, a reaction of monomeric fluoranthene derivatives, if appropriate together with further comonomers, in which all polymerizable groups $X^1$, $X^2$ and, if appropriate, $X^5$ and $X^6$ are halogen is preferably carried out. In this case, a nickel compound is preferably used as catalyst. Alternatively, a reaction of monomeric fluoranthene derivatives and, if appropriate, further comonomers, where the polymerizable groups $X^1$, $X^2$ or $X^3$, $X^4$ and, if appropriate, $X^5$ and $X^6$ are halogen or esterified sulfonate on the one side and boron-comprising radicals on the other side in the molar ratios indicated is carried out. In this reaction, a halogen or esterified sulfonate is in each case reacted with a boron-comprising radical. In this case, a palladium compound is preferably used as catalyst.

Preferred definitions of $X^1$, $X^2$, $X^3$, $X^4$, $X^5$, $X^6$, $R^7$ and n have been given above.

In this embodiment of the process of the invention, the polymerization in step c) is preferably carried out in the presence of a nickel or palladium compound, in particular a compound in which the metal is present in the oxidation state 0. Preference is given to using the commercially available tetrakis(triphenylphosphane)palladium [Pd(P(P$_6$H$_5$)$_3$)$_4$] or commercially available nickel compounds, for example Ni(C$_2$H$_4$)$_3$, Ni(1,5-cyclooctadiene)$_2$ ("Ni(COD)$_2$"), Ni(1,6-cyclodecadiene)$_2$ or Ni(1,5,9-all-trans-cyclododecadiene)$_2$. Very particular preference is given to using [Pd(P(C$_6$H$_5$)$_3$)$_4$] and Ni(COD)$_2$. To carry out the polymerization, an excess of P(C$_6$H$_5$)$_3$ or 1,5-cyclooctadiene, depending on the catalyst used, can be added.

When the polymerization is carried out in the presence of palladium compounds, catalytic amounts, i.e. from 0.1 to 10 mol % of Pd, based on the monomeric fluoranthene derivative of the formula IIa or IIb, are usually sufficient. If the polymerization is carried out in the presence of nickel compounds, it is usual to employ stoichiometric amounts of Ni, based on the sum of the monomeric fluoranthene derivatives of the formula IIa or IIb, if appropriate together with further comonomers.

The polymerization is usually carried out in an organic solvent, for example in toluene, ethylbenzene, meta-xylene, ortho-xylene, dimethylformamide (DMF), tetrahydrofuran, dioxane or a mixture of the abovementioned solvents. The solvent or solvents are freed of traces of moisture by customary methods prior to the polymerization.

The polymerization is usually carried out under protective gas. Suitable protective gases are nitrogen, $CO_2$ and noble gases, in particular argon or $CO_2$.

The polymerization is usually carried out in the presence of a base. Suitable bases are, for example, organic amines, with triethylamine, pyridine or collidine being particularly useful.

The polymerization can also be carried out in the presence of solid basic salts, for example alkali metal carbonates or alkali metal bicarbonates, if appropriate in the presence of a crown ether such as 18-crown-6. It is likewise possible to carry out the polymerization as a two-phase reaction using aqueous solutions of alkali metal carbonate, if appropriate in the presence of a phase transfer catalyst. In this case, it is not necessary to free the organic solvent of moisture prior to the reaction.

The polymerization usually takes from 10 minutes to 2 days, preferably from 2 hours to 24 hours. The pressure conditions are not critical, and preference is given to atmospheric pressure. The polymerization is generally carried out at elevated temperature, preferably in the range from 80° C. to the boiling point of the organic solvent or solvent mixture, particularly preferably in the range from 100° C. to the boiling point of the organic solvent or solvent mixture. The molar ratio of the sum of halogen and esterified sulfonates on the one side and boron-comprising radicals on the other side in the monomeric fluoranthene derivatives of the formula IIa and/or IIb used or the further comonomers used is from 0.8:1 to 1.2:1, preferably from 0.9:1.1 to 1.1:0.9, preferably 1:1. In the case of "end-capping", where only the end groups of a polymer have to be introduced, far smaller amounts of polymerizable groups are sufficient (10-20 mol % based on the total amount of monomer). These end caps are, however, monofunctionalized in order to stop chain growth, i.e. they are compounds of the formula IIa or IIb which each bear only one group $X^1$ or $X_2$ (in the case of compounds of the formula IIa) or $X^3$ or $X^4$ (in the case of compounds of the formula IIb).

Suitable further comonomers selected from the group consisting of aromatic, fused aromatic and heteroaromatic compounds which each have two groups $X^5$ and $X^6$ which can be polymerized with the groups $X^1$ and $X^2$ of the fluoranthene derivative of the formula IIa or the groups $X^3$ and $X^4$ of the fluoranthene derivative of the formula IIb are, in particular, the corresponding phenylene compounds, trans- or cis-ethylene compounds, acetylene comounds, naphthylene compounds, anthrylene compounds, arylamino compounds, fluorene derivatives, carbazole derivatives, dibenzofuran derivatives, pyrene derivatives, phenanthrene derivatives and/or thiophene compounds which have the abovementioned radicals $X^5$ and $X^6$. Particularly useful further monomers are aromatic, fused aromatic and heteroaromatic compounds which bear solubilizing alkyl or alkoxy side chains, for example one or two $C_3$-$C_{10}$-alkyl and/or $C_3$-$C_{10}$-alkoxy side chains, in addition to the polymerizable groups $X^5$ and $X^6$.

Particularly preferred further comonomers which are selected from the group consisting of aromatic, fused aromatic and heteroaromatic compounds which each have two groups $X^5$ and $X^6$ which can be polymerized with the groups $X^1$ and $X^2$ of the fluoranthene derivative of the formula IIa or the groups $X^3$ and $X^4$ of the fluoranthene derivative of the formula IIb and are suitable for use in the abovementioned preferred embodiment of the polymerization step c) of the process of the invention are:

phenylenebisboronic acids or their esters, preferably 1,4-phenylenebisboronic acid or its esters, and their alkyl- or alkoxy-substituted derivatives, dihalo-substituted benzenes, preferably 1,4-dihalo-substituted benzenes, and their alkyl- or alkoxy-substituted derivatives, anthracenebisboronic acids or their esters, preferably 1,5- or 9,10-anthracenebisboronic acids or their esters, and dihaloanthracenes, preferably 1,5- or 9,10-dihalo-anthracene, dihalo-substituted triarylamines and their bisboronic acids or their esters and their alkyl- or alkoxy-substituted derivatives, dihalo-substituted naphthalenes and their bisboronic acids or their esters and their alkyl- or alkoxy-substituted derivatives, in particular 1,5-dialkoxy-2,6-dibromo-naphthalene, dihalo-substituted fluorenes and their bisboronic acids or their esters and their alkyl- or alkoxy-substituted derivatives, dihalo-substituted carbazoles and their bisboronic acids or their esters and their alkyl- or alkoxy-substituted derivatives, dihalo-substituted dibenzofurans and their bisboronic acids or their esters and their alkyl- or alkoxy-substituted derivatives, dihalo-substituted pyrenes and their bisboronic acids or their esters and their alkyl- or alkoxy-substituted derivatives, dihalo-substituted phenanthrenes and their bisboronic acids or their esters and their alkyl- or alkoxy-substituted derivatives.

The at least one further comonomer is particularly preferably selected from the group consisting of phenylenebisboronic acids, phenylenebisboronic esters and dihalo-substituted triarylamines.

Suitable alkyl or alkoxy substituents are $C_3$-$C_{10}$-alkyl or $C_3$-$C_{10}$-alkoxy side chains, with the abovementioned compounds preferably bearing, if appropriate, one or two alkyl or alkoxy substituents.

The polyfluoranthenes of the invention can, if appropriate, be crosslinked further, in particular if they have at least one radical $R^1$, $R^2$, $R^3$, $R^4$, $R^5$ or $R^6$ which has one of the following meanings:

—CH=$CH_2$, —C≡CH, trans- or cis-CH=CH—$C_6H_5$, acryloyl, methacryloyl, ortho-methylstyryl, para-methylstyryl, —O—CH=$CH_2$, glycidyl,

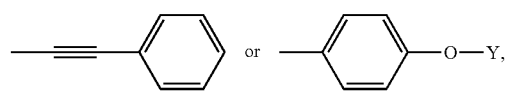

where Y is acryloyl, methacryloyl, ortho- or para-methylstyryl, —O—CH=$CH_2$ or glycidyl.

Crosslinking can be carried out photochemically in the presence of an initiator or thermally.

Thermal crosslinking is preferably carried out by heating the polyfluoranthenes of the invention in which at least one radical $R^1$ to $R^6$ has one of the abovementioned meanings in bulk or in a solvent to a temperature of preferably from 40 to 100° C. under inert gas, generally nitrogen or a noble gas. Crosslinking is preferably carried out during the course of OLED production after application of the polyfluoranthene layer. The polyfluoranthenes of the invention are particularly preferably applied as a film either as such or in a solvent, preferably to one of the electrodes (on a hole transport layer such as PEDOT on an ITO anode) of the OLED and heated under nitrogen or noble gas for a period of generally from 45 minutes to 90 minutes. The preferred temperature range has been indicated above. The procedure for carrying out thermal polymerizations is known to those skilled in the art.

When thermal crosslinking is carried out, the radicals $R^1$, $R^2$, $R^3$, $R^4$, $R^5$ or $R^6$ are particularly preferably, independently of one another, trans- or cis-CH=CH—$C_6H_5$, ortho-methylstyryl, para-methylstyryl or

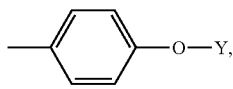

and Y is preferably trans- or cis-CH=CH—$C_6H_5$, ortho-methylstyryl or para-methylstyryl.

Photochemical crosslinking is preferably carried out by illuminating the polyfluoranthene derivative of the invention in which at least one of the radicals $R^1$ to $R^6$ has one of the abovementioned meanings, in bulk or in solution with a radiation source, for example a UV lamp, in the presence of a customary photoinitiator which is known to those skilled in the art from the photopolymerization of, for example, acrylic acid derivatives or methacrylic acid derivatives or unsaturated ethers. Crosslinking is preferably carried out during the course of OLED production after application of the polyfluoranthene layer. The polyfluoranthenes of the invention are particularly preferably applied as a film either as such or in a solvent, preferably to one of the electrodes (on a hole transport layer such as PEDOT on an ITO anode) of the OLED, and illuminated with a radiation source, for example a UV lamp, in the presence of a customary photoinitiator. The reaction conditions of photopolymerizations are known to those skilled in the art and are disclosed, for example, in EP-A 0 637 889.

When a photochemical polymerization or photopolymerization is carried out, the radicals $R^1$, $R^2$, $R^3$, $R^4$, $R^5$ or $R^6$ are, preferably, independently of one another, acryloyl, methacryloyl, —O—CH=$CH_2$, glycidyl or

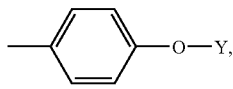

and Y is acryloyl, methacryloyl, —O—CH=$CH_2$ or glycidyl.

The present invention further provides polyfluoranthenes which can be prepared by the process of the invention. Various polyfluoranthenes are obtainable in this way, depending on the embodiment of the invention. All polyfluoranthenes have electroluminescence properties, so that the polyfluoranthenes are suitable for use in OLEDs. Preferred embodiments of the process of the invention and of the radicals of the compounds used have been mentioned above.

The ability to produce films of the polyfluoranthenes of the invention makes it possible for the polyfluoranthenes to be applied from solution to electrodes in an OLED, for example by spin coating or dipping, which makes it possible to produce large-area displays simply and inexpensively.

The present invention therefore further provides films comprising or consisting of the polyfluoranthenes of the invention or polyfluoranthenes which are prepared by the process of the invention.

The present invention further provides organic light-emitting diodes (OLEDs) comprising at least one polyfluoranthene according to the invention.

Organic light-emitting diodes (OLEDs) are basically made up of a plurality of layers.

1. Anode
2. Hole-transporting layer
3. Light-emitting layer
4. Electron-transporting layer
5. Cathode The polyfluoranthenes of the invention are preferably used as emitter molecules in the light-emitting layer. The present invention therefore also provides a light-emitting layer comprising or consisting of at least one polyfluoranthene according to the invention.

The polyfluoranthenes of the invention are generally present as such, viz. without further additives, in the light-emitting layer. However, it is likewise possible for further compounds to be present in addition to the polyfluoranthenes of the invention in the light-emitting layer. For example, a fluorescent dye can be present in order to alter the emission color of the polyfluoranthene used as emitter substance. Furthermore, a diluent material can be used. This diluent material can be a polymer, for example poly(N-vinylcarbazole) or polysilane. However, the diluent material can also be a small molecule, for example 4,4'-N,N'-dicarbazolobiphenyl (CDP) or a tertiary aromatic amine. If a diluent material is used, the proportion of the polyfluoranthene of the invention in the light-emitting layer is generally less than 20% by weight. It is usual not to use any diluent material.

The individual layers as mentioned above of the OLED can in turn be made up of two or more layers. For example, the hole-transporting layer can be made up of a layer into which holes are injected from the electrode and a layer which transports the holes from the hole injection layer away into the light-emitting layer. The electron-transporting layer can likewise consist of a plurality of layers, for example a layer into which electrons are injected by the electrode and a layer which receives electrons from the electron injection layer and transports them into the light-emitting layer. Each of these layers are selected according to factors such as energy level, temperature resistance and charge carrier mobility, and also the energy difference between the layers mentioned and the organic layers or the metal electrodes. A person skilled in the art is able to choose the structure of the OLEDs so that it is optimally matched to the polyfluoranthenes used according to the invention as emitter substances.

To obtain particularly efficient OLEDs, the HOMO (highest occupied molecular orbital) of the hole-transporting layer should be matched to the work function of the anode and the LUMO (lowest unoccupied molecular orbital) of the electron-transporting layer should be matched to the work function of the cathode.

The present invention further provides an OLED comprising at least one light-emitting layer according to the invention. The further layers in the OLED can be made up of any material which is customarily used in such layers and is known to those skilled in the art.

The anode (1) is an electrode which supplies positive charge carriers. It can, for example, be composed of materials which comprise a metal, a mixture of various metals, a metal alloy, a metal oxide or a mixture of various metal oxides. As an alternative, the anode can be a conductive polymer. Suitable metals comprise the metals of groups Ib, IVa, Va and VIa of the Periodic Table of the Elements and also the transition metals of group VIII. If the anode is to be translucent, use is generally made of mixed metal oxides of groups IIb, IIIb and IVb of the Periodic Table of the Elements, for example indium-tin oxide (ITO). It is likewise possible for the anode (1) to comprise an organic material, for example polyaniline, as described, for example, in Nature, Vol. 357, pages 477 to 479 (Jun. 11, 1992). At least either the anode or the cathode should be at least partially transparent to enable the light produced to be emitted.

Suitable hole transport materials for layer (2) of the OLED of the invention are disclosed, for example, in Kirk-Othmer Encyclopedia of Chemical Technology, 4th edition, Vol. 18, pages 837 to 860, 1996. Both hole-transporting molecules and polymers can be used as hole transport material. Hole-transporting molecules usually used are selected from the group consisting of 4,4'-bis[N-(1-naphthyl)-N-phenyl-amino]biphenyl (α-NPD), N,N'-diphenyl-N,N'-bis(3-methylphenyl)[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)[1,1'-(3,3'-dimethyl) biphenyl]-4,4'-diamine (ETPD), N,N,N',N'-tetrakis(3-methylphenyl)-2,5-phenylenediamine (PDA), α-phenyl-4-N,N-diphenylaminostyrene (TPS), p-(diethylamino) benzaldehyde diphenylhydrazone (DEH), triphenylamine (TPA), bis[4-(N,N-diethylamino)-2-methylphenyl)(4-methylphenyl)-methane (MPMP), 1-phenyl-3-[p-(diethylamino) styryl]-5-[p-(diethylamino)phenyl]-pyrazoline (PPR or DEASP), 1,2-trans-bis(9H-carbazol-9-yl)cyclobutane (DCZB), N,N,N',N'-tetrakis(4-methylphenyl)(1,1'-biphenyl)-4,4'-diamine (TTB) and porphyrin compounds such as copper phthalocyanines. Hole-transporting polymers usually used are selected from the group consisting of polyvinylcarbazoles, (phenylmethyl)polysilanes and polyanilines. It is likewise possible to obtain hole-transporting polymers by doping polymers such as polystyrene and polycarbonate with hole-transporting molecules. Suitable hole-transporting molecules are the molecules which have been mentioned above.

Suitable electron-transporting materials for the layer (4) of the OLEDs of the invention comprise metals chelated by oxinoid compounds, e.g. tris(8-quinolinolato)aluminum ($Alq_3$), compounds based on phenanthroline, e.g. 2,9-dimethyl-4,7-diphenyl-1,10-phenanthroline (DDPA) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ). Here, the layer (4) can serve both to aid electron transport and as buffer layer or barrier layer to avoid quenching of the exciton at the interfaces of the layers of the OLED. The layer (4) preferably improves the mobility of electrons and reduces quenching of the exciton.

The cathode (5) is an electrode which serves to introduce electrons or negative charge carriers. The cathode can be any metal or nonmetal which has a lower work function than the anode. Suitable materials for the cathode are selected from the group consisting of alkali metals of group 1, for example Li, Cs, alkaline earth metals of group 2, metals of group 12 of the Periodic Table of the Elements, comprising the rare earth metals and the lanthanides and actinides. Furthermore, metals such as aluminum, indium, calcium, barium, samarium and magnesium and combinations thereof can also be used. Furthermore, lithium-comprising oganometallic compounds or LiF can be applied between the organic layer and the cathode to reduce the operating voltage.

The OLED of the present invention can additionally comprise further layers which are known to those skilled in the art. For example, a layer which aids transport of the positive charge and/or matches the band gap of the layers to one another can be applied between the layer (2) and the light-emitting layer (3). As an alternative, this layer can serve as protective layer. In an analogous way, additional layers can be present between the light-emitting layer (3) and the layer (4) in order to aid transport of the negative charge and/or match the band gap between the layers to one another.

In a preferred embodiment, the OLED of the invention comprises, in addition to the layers (1) to (5), at least one of the following further layers:
 a hole injection layer between the anode (1) and the hole-transporting layer (2);
 a blocking layer for electrons between the hole-transporting layer (2) and the light-emitting layer (3);
 a blocking layer for holes between the light-emitting layer (3) and the electron-transporting layer (4);
 an electron injection layer between the electron-transporting layer (4) and the cathode (5).

A person skilled in the art will know how suitable materials have to be selected (for example on the basis of electrochemical tests). Suitable materials for the individual layers are known to those skilled in the art and are disclosed, for example, in WO 00/70655. Furthermore, each of the above-mentioned layers of the OLED of the invention can be made up of two or more layers. It is also possible for some or all of the layers (1), (2), (3), (4) and (5) to be surface-treated in order to increase the efficiency of charge carrier transport. The choice of materials for each of the layers mentioned is preferably made so as to obtain an OLED having a high efficiency.

The OLEDs of the invention can be produced by methods known to those skilled in the art. In general, the OLED is produced by successive vapor deposition of the individual layers on a suitable substrate. Suitable substrates are, for example, glass or polymer films. Vapor deposition can be carried out using customary techniques such as thermal vaporization, chemical vapor deposition and others. In an alternative process, the organic layers can be applied from solutions or dispersions in suitable solvents using coating techniques known to those skilled in the art. Vapor deposition is not necessary for applying the polyfluoranthenes of the invention. The polyfluoranthenes are generally either polymerized directly on top of the previous layer to form the desired film (the desired layer) comprising or consisting of at least one polyfluoranthene according to the invention. In a further embodiment, the inventive polyfluoranthenes of the formula I are applied from solution in organic solvents such as ethers, chlorinated hydrocarbons, for example methylene chloride, and aromatic hydrocarbons, for example toluene. The application itself can be carried out by means of conventional techniques, for example spin-coating, dipping, film-forming doctorblade coating (screen printing technique), by application by means of an inkjet printer or by stamp printing, for example by means of PDMS, i.e. stamp printing using a silicone rubber stamp which has been photochemically structured.

In general, the various layers have the following thicknesses: anode (2) from 500 to 5000 Å, preferably from 1000 to 2000 Å; hole-transporting layer (3) from 50 to 1000 Å, preferably from 200 to 800 Å, light-emitting layer (4) from 10 to 2000 Å, preferably from 30 to 1500 Å, electron-transporting layer (5) from 50 to 1000 Å, preferably from 200 to 800 Å, cathode (6) from 200 to 10000 Å, preferably from 300 to 5000 Å. The position of the recombination zone of holes and electrons in the OLED of the invention and thus the emission spectrum of the OLED can be influenced by the relative thickness of each layer. This means that the thickness of the electron transport layer should preferably be selected so that the electron/hole recombination zone is located in the light-emitting layer. The ratio of the thicknesses of the individual layers in the OLED is dependent on the materials used. The thicknesses of any additional layers used are known to those skilled in the art.

The use of the fluoranthenes of the invention in the light-emitting layer of the OLEDs of the invention enables OLEDs having a high efficiency to be obtained. The efficiency of the OLEDs of the invention can also be improved by optimization of the other layers. For example, highly efficient cathodes such as Ca, Ba or LiF can be used. Shaped substrates and new hole-transporting materials which give a reduction in the operating voltage or an increase in the quantum efficiency can likewise be used in the OLEDs of the invention. Furthermore, additional layers can be present in the OLEDs to adjust the energy level of the various layers and to aid electroluminescence.

The OLEDs of the invention can be used in all devices in which electroluminescence is useful. Suitable devices are preferably selected from among stationary and mobile VDUs. Stationary VDUs are, for example, VDUs of computers, televisions, VDUs in printers, kitchen appliances and also advertising signs, lighting and information signs. Mobile VDUs are, for example, VDUs in mobile telephones, laptops, vehicles and also destination displays on buses and trains.

Furthermore, the fluoranthenes of the invention can also be used in OLEDs having an inverted structure. Once again, the polyfluoranthenes of the invention are preferably used in the light-emitting layer, particularly preferably as light-emitting layer without further additives, in these inverted OLEDs. The structure of inverted OLEDs and the materials usually used therein are known to those skilled in the art.

The inventive polyfluoranthenes of the formula I are thus suitable as emitter substances in organic light-emitting diodes. The present invention therefore also provides for the use of the inventive polyfluoranthenes of the formula I as emitter substances in organic light-emitting diodes.

The following examples illustrate the invention.

EXAMPLES

For the purposes of the present invention, the nomenclature of the fluoranthenes is according to the following scheme:

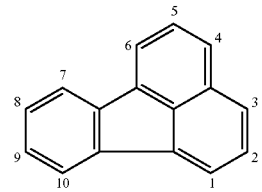

Monomer Syntheses 7,9-Bis(4-bromophenyl)cyclopenta[a]acenaphthylen-8-one

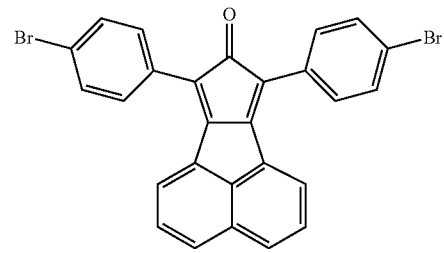

12.3 g of 1,3-[di(4-bromophenyl)]propanone (synthesized as described by Collman et al., *J. Am. Chem. Soc.* 1972, 94, 1788) and 9.06 g of acenaphthenequinone were refluxed in 250 ml of ethanol. 2.7 g of a 20% strength potassium hydroxide solution in ethanol were then added, resulting in the solution immediately becoming deep violet. After refluxing for 16 hours, 1500 ml of ethanol were added and the mixture was stirred for a further one hour. The black-gray crystals which precipitated (16.7 g) were filtered off and washed a number of times with ethanol.

Substituted cyclopentaacenaphthylenones have been described in JP 10-169992.

7,10-Bis(4-bromophenyl)-8,9-diphenylfluoranthene

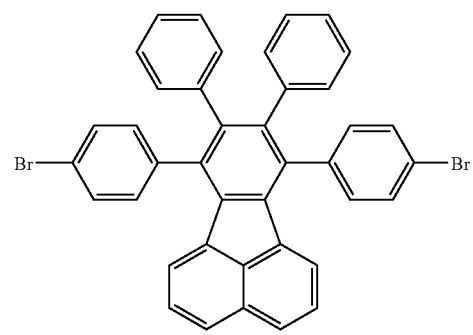

0.65 g of diphenylacetylene (prepared as described by Herwig et al., *Adv. Mater.* 1996, 8, 510) and 1.9 g of 7,9-bis(4-bromophenyl)cyclopenta[a]acenaphthylen-8-one were dissolved in 10 g of diphenyl ether and refluxed for 14 hours.

Distilling off the solvent and chromatography on silica gel (Merck silica gel 60, ethyl acetate/cyclohexane) gave 0.12 g of a beige solid.

7,10-Bis(4-bromophenyl)-8,9-bis(4-octylphenyl)fluoranthene

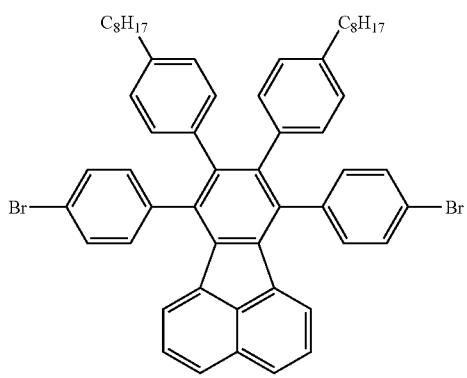

1 g of 4,4'-dioctyldiphenylacetylene (prepared as described by Herwig et al., *Adv. Mater.* 1996, 8, 510) and 1.9 g of 7,9-bis(4-bromophenyl)cyclopenta[a]acenaphthylen-8-one were dissolved in 10 g of diphenyl ether and refluxed for 14 hours. Distilling off the solvent and reprecipitation in methanol gave 0.5 g of a beige solid.

7,10-Bis(4-bromophenyl)-8-nonyl-9-octylfluoranthene

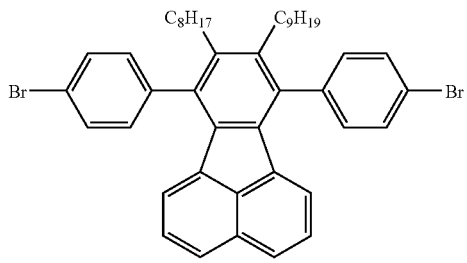

2 g of 1-nonadecyne and 4 g of 7,9-bis(4-bromophenyl)cyclopenta[a]acenaphthylen-8-one were dissolved in 15 g of diphenyl ether and refluxed for 16 hours. Distilling off the solvent and chromatography on silica gel (Merck silica gel 60, ethyl acetate/cyclohexane) gave 3 g of a yellowish solid.

Polymer Syntheses

The polymer syntheses were carried out by methods known to those skilled in the art Suzuki polymerizations using palladium(0) are described, for example, in WO 00/22026 and WO 00/53656, and Yamamoto polymerizations using nickel(0) are described in U.S. Pat. No. 5,708,130.

Polymerization of 7,10-bis(4-bromophenyl)-8,9-bis(4-octylphenyl)fluoranthene

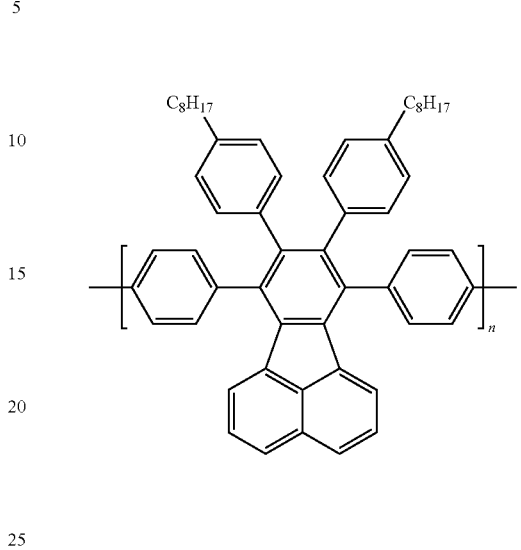

0.55 g of 7,10-bis(4-bromophenyl)-8,9-bis(4-octylphenyl)fluoranthene, 0.39 g of bis(1,5-cyclooctadiene)nickel(0), 0.22 g of 2,2'-bipyridine and 0.1 g of 1,5-cyclooctadiene were heated in 20 ml of dimethylformamide at 80° C. under argon for 3 days. The reaction mixture is precipitated in an acetone/methanol/hydrochloric acid mixture, and subsequently a number of times in methanol. This gives a beige-brown solid.

$M_w$=13100, $\lambda_{max,em}$(toluene)=472 nm

Polymerization of 7,10-bis(4-bromophenyl)-8-nonyl-9-octylfluoranthene

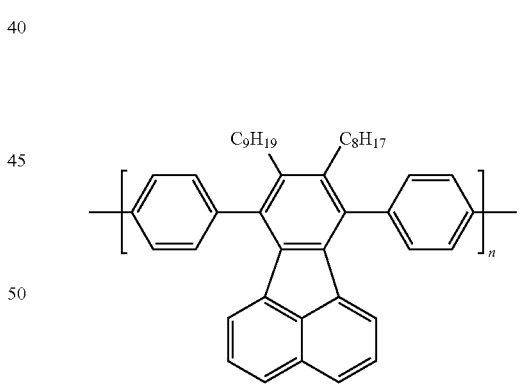

0.51 g of 7,10-bis(4-bromophenyl)-8-nonyl-9-octylfluoranthene, 0.19 g of bis(1,5-cyclooctadiene)nickel(0), 0.11 g of 2,2'-bipyridine and 0.05 g of 1,5-cyclooctadiene were heated in a mixture of 15 ml of dimethylformamide and 5 ml of toluene at 80° C. under argon for 3 days. The reaction mixture is precipitated in an acetone/methanol/hydrochloric acid mixture, and subsequently a number of times in methanol. This gives a yellowish solid.

$M_w$=4400, $\lambda_{max,em}$(toluene)=466 nm

Polymerization of 7,10-bis(4-bromophenyl)-8-nonyl-9-octylfluoranthene and phenylene-1,3-bis(pinacolato boronate)

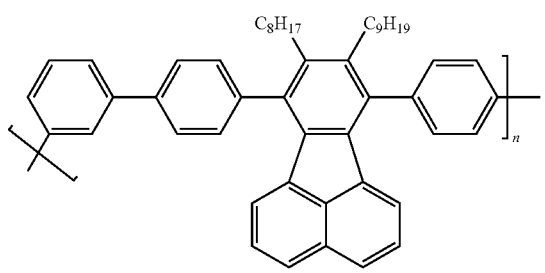

0.2 g of 7,10-bis(4-bromophenyl)-8-nonyl-9-octylfluoranthene, 0.09 g of phenylene-1,3-bis(pinacolato boronate) (synthesized from 1,3-dibromobenzene and bis(pinacolato boronate) by the method of Miyaura et al., J. Org. Chem. 1995, 60, 7508) and 0.03 g of tetrakis(triphenylphosphine)palladium(0) were heated in a mixture of 10 ml of toluene and 5 ml of 40% strength potassium carbonate solution at 80° C. under argon for 3 days. The reaction mixture is subsequently precipitated a number of times in methanol. This gives a yellowish solid.

$M_w$=11100, $\lambda_{max,em}$(toluene)=468 nm

Polymerization of 7,10-bis(4-bromophenyl)-8-nonyl-9-octylfluoranthene and 2,5-bis(hexyl)-1,4-phenylenebisboronic acid

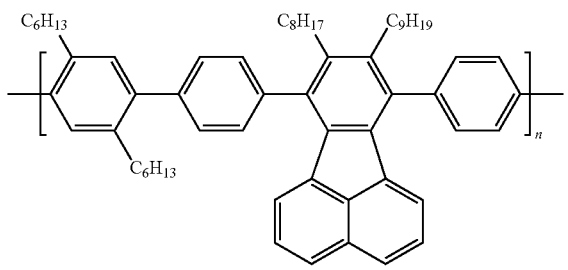

0.2 g of 7,10-bis(4-bromophenyl)-8-nonyl-9-octylfluoranthene, 0.31 g of 2,5-bis(hexyl)-1,4-phenylenebisboronic acid (synthesized from 2,5-bis(hexyl)-1,4-dibromobenzene and bis(pinacolato boronate) by the method of Miyaura et al., J. Org. Chem. 1995, 60, 7508) and 0.1 g of tetrakis(triphenylphosphine)palladium(0) were heated in a mixture of 20 ml of toluene and 50 ml of 40% strength potassium carbonate solution at 80° C. under argon for 3 days. The reaction mixture is subsequently precipitated a number of times in methanol. This gives a beige-brown solid.

$M_w$=8500, $\lambda_{max,em}$(toluene)=469 nm, $\lambda_{max,em}$(film)=469 nm

Polymerization of 7,10-bis(4-bromophenyl)-8-nonyl-9-octylfluoranthene

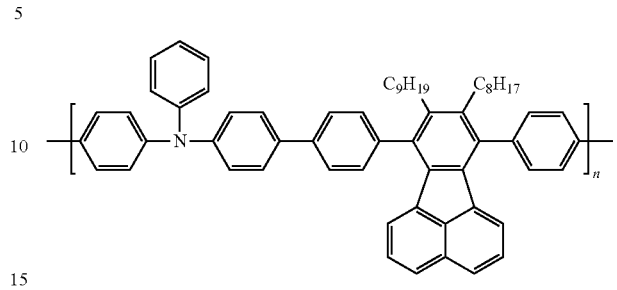

0.26 g of 7,10-bis(4-bromophenyl)-8-nonyl-9-octylfluoranthene, 0.19 g of bis(1,5-cyclooctadiene)nickel(0), 0.14 g of 2,2'-bipyridine, 0.014 g of bis(4-bromophenyl)-phenylamine and 0.06 g of 1,5-cyclooctadiene were heated in a mixture of 5 ml of dimethylformamide and 5 ml of toluene at 80° C. under argon for 3 days. The reaction mixture is precipitated in an acetone/methanol/hydrochloric acid mixture, and subsequently a number of times in methanol. This gives a yellowish solid.

$M_w$=7300, $\lambda_{max,em}$(toluene)=467 nm

The invention claimed is:

1. A process for preparing polyfluoranthenes comprising repeating units of the general formula I

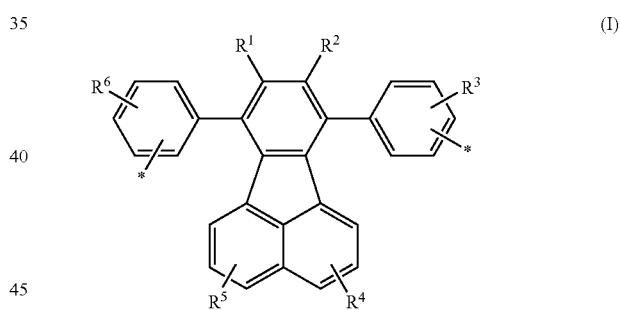

which comprises:

a) preparation of a monomeric fluoranthene derivative of the formula IIa

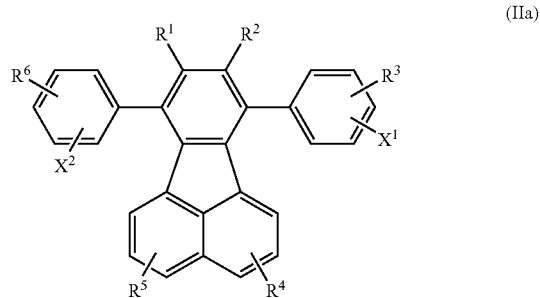

by reaction of a compound of the formula III

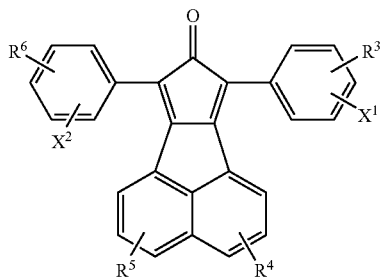

with an alkynyl compound of the formula IV

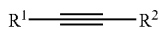

and subsequent carbon monoxide elimination;
b) optionally, reaction of the monomeric fluoranthene derivative of the formula IIa to form a monomeric fluoranthene derivative of the formula IIb

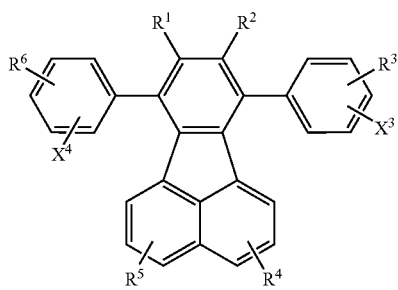

c) polymerization of the monomeric fluoranthene derivative of the formula IIa or IIb, optionally, together with at least one further comonomer selected from the group consisting of further fluoranthene derivatives of the formula IIa or IIb which are different from the first fluoranthene derivative of the formula IIa or IIb, aromatic, fused aromatic and heteroaromatic compounds which each have two groups $X^5$ and $X^6$ which can be polymerized with the groups $X^1$ and $X^2$ of the fluoranthene derivative of the formula IIa or the groups $X^3$ and $X^4$ of the fluoranthene derivative of the formula IIb;
where:
$R^1$, $R^2$, $R^3$
$R^4$, $R^5$, $R^6$ are each, independently of one another, H, an alkyl radical, an alkynyl radical, an aryloxy radical, an aromatic radical, a fused aromatic ring system, a heteroaromatic radical, —CH=CH$_2$, trans- or cis-CH=CH—C$_6$H$_5$, acryloyl, methacryloyl, methylstyryl, —O—CH=CH$_2$, glycidyl,

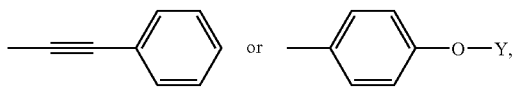

where Y is acryloyl, methacryloyl, ortho- or para-methylstyryl;
$X^1$ and $X^2$ are each a halogen selected from the group consisting of F, Cl, Br and I, or NO$_2$;
$X^3$ and $X^4$ are each a halogen selected from the group consisting of F, Cl, Br and I; an esterified sulfonate; or a boron-comprising radical of the formula —B(O[C(R$^7$)$_2$]$_n$—O), where the radicals R$^7$ are identical or different and are each, independently of one another, H or C$_1$-C$_{20}$-alkyl, and n is an integer of from 2 to 10;
$X^5$ and $X^6$ are each a halogen selected from the group consisting of F, Cl, Br and I; an esterified sulfonate; or a boron-comprising radical of the formula —B(O—[C(R$^7$)$_2$]$_n$—O), where the radicals R$^7$ are identical or different and are each, independently of one another, H or C$_1$-C$_{20}$-alkyl, and n is an integer of from 2 to 10; and
wherein only one of $X^3$ or $X^4$ is a halogen.

2. The process according to claim 1, wherein $R^4$ and $R^5$ are each H.

3. The process according to claim 1, wherein $R^3$ and $R^6$ are each H.

4. The process according to claim 1, wherein $R^1$ and $R^2$ are alkyl radicals.

5. The process according to claim 1, wherein $R^1$ and $R^2$ are C$_3$-C$_{10}$-alkyl radicals.

6. The process according to claim 1, wherein $R^1$ and $R^2$ are C$_5$-C$_9$-alkyl radicals.

7. The process according to claim 1, wherein $R^1$ and $R^2$ are C$_5$-C$_9$-linear alkyl radicals.

8. The process of claim 1, wherein the polymerization forms a polyfluoranthene that consists of the fluoranthenes of formula (IIa) and (IIb).

9. The process of claim 1, wherein the polymerization forms a homopolymer of the fluoranthenes of formula IIa and optionally IIb.

10. The process according to claim 1, wherein the polymerization forms a polyfluoranthene having a solution $\lambda_{max,em}$ in toluene of 466-472 nm.

11. The process according to claim 1, wherein the polymerization in step c) is carried out in the presence of nickel or palladium compounds.

12. The process according to claim 11, wherein:
$X^1$ and $X^2$ are each a halogen selected from the group consisting of F, Cl, Br and I; or
$X^3$ and $X^4$ are each a halogen selected from among F, Cl, Br and I, an esterified sulfonate or a boron-comprising radical of the formula —B(O—[C(R$^7$)$_2$]$_n$—O and
$X^5$ and $X^6$ are each a halogen selected from the group consisting of F, Cl, Br and I, an esterified sulfonate or a boron-comprising radical of the formula —B(O—[C(R$^7$)$_2$]$_n$—O;
the radicals R$^7$ are identical or different and are each, independently of one another, H or C$_1$-C$_{20}$-alkyl;
n is an integer from 2 to 10;
with the proviso that
the radicals $X^1$ and $X^2$ or $X^3$ and $X^4$ and also $X^5$ and $X^6$ are selected so that the molar ratio of halogen and esterified sulfonate to boron-comprising radical is from 0.8:1 to 2.1:1,
or
the radicals in the monomeric fluoranthene derivative are each halogen and these are reacted, optionally together with further comonomers in which the radicals $X^5$ and $X^6$ are likewise each halogen.

13. The process according to claim 11, wherein the at least one further comonomer is selected from the group consisting of phenylenebisboronic acids, phenylenebisboronic esters, the alkyl- or alkoxy-substituted derivatives of the phenylenebisboronic acids or phenylenebisboronic esters; dihalo-substituted benzenes, alkyl- or alkoxy-substituted derivatives of the dihalo-substituted benzenes; anthracenebisboronic acids, anthracenebisboronic esters, dihaloanthracene, dihalo-substituted triarylamines, the bisboronic acids of dihalo-substituted triarylamines, the esters of the bisboronic acids of dihalo-substituted triarylamines, the alkyl- or alkoxy-substituted derivatives of the dihalo-substituted triarylamines, their bisboronic acids, their bisboronic esters, dihalo-substituted naphthalenes, the bisboronic acids of the halo-substituted naphthalenes, the bisboronic esters of the dihalo-substituted naphthalenes, their alkyl- or alkoxy-substituted derivatives; dihalo-substituted fluorenes, the bisboronic acids of the dihalo-substituted fluorenes, the esters of the bisboronic acids of the dihalo-substituted fluorenes, their alkyl- or alkoxy-substituted derivatives; dihalo-substituted carbazoles, the bisboronic acids of the dihalo-substituted carbazoles, the bisboronic esters of the dihalo-substituted carbazoles, their alkyl- or alkoxy-substituted derivatives; dihalo-substituted dibenzofurans, the bisboronic acids of the dihalo-substituted dibenzofurans, the bisboronic esters of the dihalo-substituted dibenzofurans, their alkyl- or alkoxy-substituted derivatives; dihalo-substituted pyrenes, the bisboronic acids of the dihalo-substituted pyrenes, the bisboronic esters of the dihalo-substituted pyrenes, their alkyl- or alkoxy-substituted derivatives, dihalo-substituted phenanthrenes, the bisboronic acids of the dihalo-substituted phenanthrenes, the esters of the bisboronic acids of the dihalo-substituted phenanthrenes and their alkyl- or alkoxy-substituted derivatives.

14. The process according to claim 13, wherein the at least one further comonomer is selected from the group consisting of phenylenebisboronic acids, phenylenebisboronic esters and dihalo-substituted triarylamines.

15. A polyfluoranthene which is prepared by a process according to claim 1.

16. A film comprising at least one polyfluoranthene according to claim 15.

17. An organic light-emitting diode comprising at least one polyfluoranthene according to claim 15.

18. A device selected from the group consisting of stationary VDUs and mobile VDUs which comprises an OLED according to claim 17.

19. A light-emitting layer comprising at least one polyfluoranthene according to claim 15.

20. An organic light-emitting diode comprising a light-emitting layer according to claim 19.

21. A device selected from the group consisting of stationary VDUs and mobile VDUs which comprises an OLED according to claim 20.

* * * * *